United States Patent
Matsusaka

(10) Patent No.: US 6,498,575 B2
(45) Date of Patent: Dec. 24, 2002

(54) D/A CONVERTER

(75) Inventor: Hiromi Matsusaka, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/921,474

(22) Filed: Aug. 3, 2001

(65) Prior Publication Data

US 2002/0014984 A1 Feb. 7, 2002

(30) Foreign Application Priority Data

Aug. 4, 2000 (JP) ........................................ 2000-236996

(51) Int. Cl.⁷ ................................................ H03M 1/66
(52) U.S. Cl. ..................... 341/144; 341/136; 341/153
(58) Field of Search ............................ 341/133, 136, 341/144, 153, 154

(56) References Cited

U.S. PATENT DOCUMENTS

| | | | | |
|---|---|---|---|---|
| 4,587,477 A | * | 5/1986 | Hornak et al. | 341/153 |
| 5,059,977 A | * | 10/1991 | Herman et al. | 341/144 |
| 5,294,929 A | | 3/1994 | Numata et al. | 341/144 |
| 5,870,049 A | * | 2/1999 | Huang et al. | 341/144 |
| 6,008,747 A | | 12/1999 | Iida | 341/135 |

FOREIGN PATENT DOCUMENTS

| | | |
|---|---|---|
| JP | 08-125538 | 5/1996 |
| JP | 08-265125 | 10/1996 |
| JP | 11-251912 | 9/1999 |

* cited by examiner

Primary Examiner—Howard L. Williams
(74) Attorney, Agent, or Firm—Pearne & Gordon LLP

(57) ABSTRACT

While a current of a constant current source 503 is equally divided to a plurality of current paths so as to produce a unit current, switches which are series-connected to the respective current paths are controlled by a switch circuit 504 in response to a digital input signal. As a result, since both output currents 505 and 506 whose unit currents are variable can be obtained, a total number of circuit components is reduced, so that not only an occupied area may be reduced, but also resolution in the vicinity of a center may be improved.

8 Claims, 9 Drawing Sheets

| SEL1 | SEL2 | TP1 | TP2 | CURRENT INPUT TERMINAL 70 | CURRENT OUTPUT TERMINAL 75 | CURRENT OUTPUT TERMINAL 76 |
|---|---|---|---|---|---|---|
| 1 | 1 | OFF | OFF | 0 | 0 | 0 |
| 1 | 0 | OFF | ON | is | 0 | is |
| 0 | 1 | ON | OFF | is | is | 0 |
| 0 | 0 | ON | ON | is | is/2 | is/2 |

FIG. 11
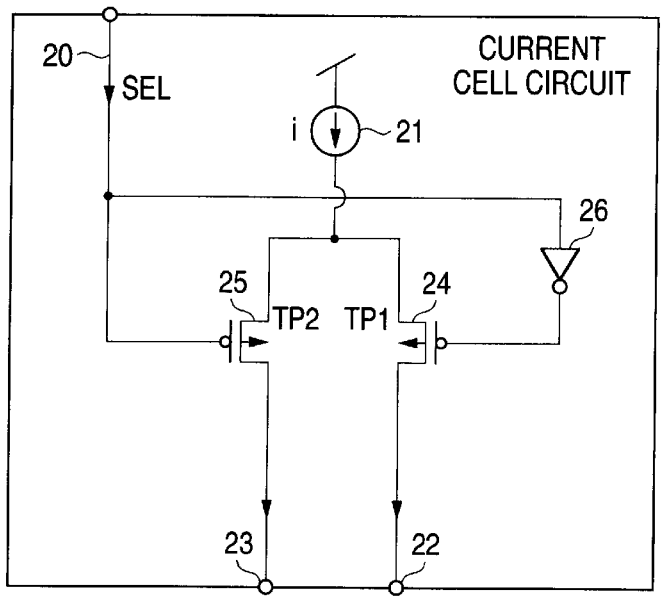
FIG. 12
| SEL | TP1 | TP2 | CURRENT OUTPUT TERMINAL 22 | CURRENT OUTPUT TERMINAL 23 |
|---|---|---|---|---|
| 1 | ON | OFF | i | 0 |
| 0 | OFF | ON | 0 | i |
FIG. 13
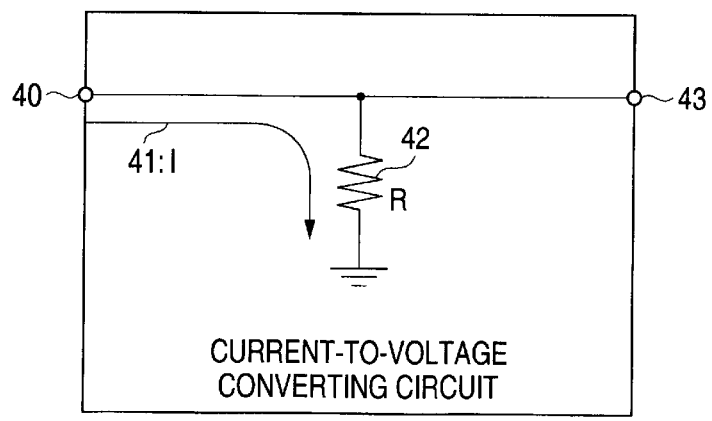

D/A CONVERTER

BACKGROUND OF THE INVENTION

1. Field of the Invention

The present invention is related to a D/A converter for outputting an analog signal in correspondence with a digital input signal.

2. Description of the Related Art

Very recently, since fine processing techniques of semiconductor integrated circuits are specifically improved, there is great progress in digital processing techniques for conventional analog processing systems. In digital processing systems, there are many possibilities that input/output signals of such digital processing systems are produced in analog signal forms. Therefore, digital-to-analog (D/A) converters capable of converting digital signals into analog signals are necessarily required in such digital processing systems, the important aspect of which is considerably increased.

Subsequently, a conventional D/A converter will now be explained. FIG. 10 shows a structural diagram of an n-bit D/A converter. Reference numeral 10 indicates an n-bit digital input signal, and reference numeral 11 represents a decode circuit for outputting "k" pieces of control signals used to select a predetermined current cell circuit in response to the digital input signal 10. Symbol "k" is equal to "$2^n-1$." Also, reference numeral 12 indicates "k" pieces of current cell selection signals which are outputted from the decode circuit 11, and reference numeral 13 represents "k" pieces of current cell circuits which are 25 selected by the current cell selection signal 12 and also own values equal to each other. Reference numeral 14 denotes an output current which is produced by adding such output currents of current cell circuits selected by the current cell selection signal 12 among all of the current cell circuits 13, reference numeral 15 indicates another output current which is produced by adding such output currents of current cell circuits other than the current cell circuits selected by the current cell selection signal 12 among all of the current cell circuits 13. Also, reference numeral 16 shows a current-to-voltage converting circuit for converting the output current 14 into a voltage corresponding thereto, reference numeral 17 denotes a current-to-voltage converting circuit for converting the output current 15 into a voltage corresponding thereto, reference numeral 18 represents an analog output terminal from which the voltage converted by the current-to-voltage converting circuit 16 is outputted, and reference numeral 19 shows an analog output terminal from which the voltage converted by the current-to-voltage converting circuit 17 is outputted.

FIG. 11 is a structural diagram for showing a structure of the current cell circuit 13. Reference numeral 20 shows a current cell selection signal, reference numeral 21 represents a constant current source for supplying a unit current "i", reference numeral 22 indicates a current output terminal to which the current "i" is supplied in the case that the current output terminal is selected by the current cell selection signal 20, and reference numeral 23 indicates a current output terminal to which the current "i" is supplied in such a case that the current output terminal is not selected by the current cell selection signal 20. Also, reference numeral 24 shows a Pch transistor having a switch function and connected to a current path provided on the side of the current output terminal 22, reference numeral 25 represents another Pch transistor having a switch function and connected to a current path provided on the side of the current output terminal 23, and also reference numeral 26 shows an inverter for inverting the current cell selection signal 20 which is supplied to the gate of the Pch transistor 24.

Next, a description will be made of operations of the current cell circuit of FIG. 11. As indicated in FIG. 11, the current cell selection signal 20 is supplied to the gate of the Pch transistor 25, and also is supplied via the inverter 26 to the gate of the Pch transistor 24 so as to activate the switch function of any one of the current paths of the current cell circuits, so that the output currents derived from the current output terminals 22 and 23 are controlled.

FIG. 12 shows a relationship explanatory diagram for explaining the current cell selection signal 20 (SEL), and values of currents supplied to both the current output terminal 22 and the current output terminal 23. In such a case that the current cell selection signal 20 (SEL)=1, since the Pch transistor 24 (TP1) is turned ON and the Pch transistor 25 (TP2) is turned OFF, the unit current "i" is supplied only to the current output terminal 22 whereas the unit current "i" is not supplied to the current output terminal 23. Contrary to the above case, in such a case that the current cell selection signal 20 (SEL)=0, since the Pch transistor 25 (TP2) is turned ON and the Pch transistor 24 (TP1) is turned OFF, the unit current "i" is supplied only to the current output terminal 23 whereas the unit current "i" is not supplied to the current output terminal 22.

FIG. 13 is a structural diagram of the current-to-voltage converting circuits 16 and 17. Reference numeral 40 indicates a current input terminal, reference numeral 41 shows an input current having a current value "I", reference numeral 42 indicates a resistive element having a resistance value "R", and reference numeral 43 indicates a voltage output terminal. Next, a description will be made of operations of the current-to-voltage converting circuits 16 and 17. The input current 41 entered from the current input terminal 40 flows entirely via the resistive element 42 to the ground at the zero potential. At this time, such a voltage defined by I×R is produced at the voltage output terminal 43 based upon the law of Ohm.

Now, operations of the n-bit D/A converter with employment of the above-explained circuit arrangement shown in FIG. 10 will be described. Assuming now that a total number of the above-explained current cell circuits 13 is "m" (symbol "m"=0, 1, 2, ..., k) which are selected in response to the digital input signal 10, the output current 14 becomes "m×i," and the output current 15 becomes (k−m) X i. As a consequence, in the case that both the current-to-voltage converting circuit 16 and the current-to-voltage converting circuit 17 are arranged by the resistive element having the resistance value "R", such a voltage having a value of "m×i×R" is outputted from the analog output terminal 18, and such a voltage having a value of "(k−m)×i×R" is outputted from the analog output terminal 19. In this case, since symbol "m" may own values from "0" to ($2^n-1$), it is possible to realize such a D/A converter having ($2^n$) pieces of gradation, namely n-bit resolution in response to the digital input signal.

However, the above-explained conventional D/A converter owns the below-mentioned problems. That is, in the conventional D/A converter having the above-described structure, the unit current is realized by the constant current source. As a result, a plurality of constant current sources are required whose total number is equal to the necessary gradation number. For instance, in the case of a 10-bit D/A converter, 1023 (=$2^{10}$) pieces of such constant current sources are necessarily required. Since the respective constant current sources are made of analog elements, the occupied area of these constant current sources which occupy the silicone wafer within the semiconductor integrated circuit is large. Moreover, in such a case that the resolution is increased by 1 bit, the resultant occupied area becomes approximately two times. Since product cost of a semiconductor integrated circuit largely depends upon an occupied area of this circuit, such a circuit design must be avoided which may induce an increase of the occupied area. In such a technical field of digital mobile communication terminal apparatuses which are known as typical digital processing systems, area-reducing of semiconductor integrated circuits which constitute major circuit components are very important, while terminal apparatuses are gradually made compact and in light weight. Furthermore, when the occupied area on the silicon wafer of the semiconductor integrated circuit is increased, the fluctuations of the respective circuit components on the circuit plane are increased. Otherwise, the wiring line length is made longer. As a result, the adverse influences caused by the impedances of the respective wiring lines are increased, which could deteriorate the precision of the D/A converter.

SUMMARY OF THE INVENTION

The present invention has been made to solve the above-explained structural problems, and therefore, has an object to provide such a D/A converter capable of reducing an occupied area of a circuit and at the same time capable of improving resolution by largely reducing a total number of circuit components thereof, as compared with the structure of the conventional D/A converter.

A D/A converter, according to a first aspect of the present invention, is featured by such a D/A converter comprising: a constant current source (constant current source 503); a switch group constituted by switch circuits (switch circuit 504), which is series-connected to the constant current source, and is operated in response to a control signal (current path selection signal 502) to form a plurality of current paths for equally dividing a constant current of the constant current source; decode means (decode circuit 501) for outputting the control signal used to control operations of the switch circuits in response to a digital input signal (digital input signal 500); and current-to-voltage converting means (current/voltage converting circuit 508) for adding currents to each other which are outputted via the current paths of the switch circuits so as to convert the added currents into a voltage.

A D/A converter, according to a second aspect of the present invention, is featured by that in the D/A converter, the constant current is obtained by employing a resistive element (resistive element 511) having one end to which a constant voltage is added instead of the constant current source.

A D/A converter, according to a third aspect of the present invention, is featured by that in the D/A converter, the constant current source is a single constant current source; the switch circuit includes: a plurality of lower-stage switching elements (Pch transistors 73, 74) for forming the plurality of current paths; and an upper-stage switching element (Pch transistor 77) which is series-connected to an upper stage of each of the lower-stage switching elements, and forms a current path for determining a shunt value of the constant currents supplied to the plurality of current paths; and the decode means outputs such a control signal (upper-stage current path selection signal 78, low-stage current path selection signals 71, 72) capable of independently controlling the respective switching elements.

A D/A converter, according to a fourth aspect of the present invention, is featured by that in the D/A converter, a plurality of D/A converters (D/A converter 603) are connected in parallel to each other; and the D/A converter is comprised of decode means (decode circuit 601) for outputting such a signal (D/A converter control signal 602) used to control the respective decode means which constitute the D/A converters in response to a digital input signal (digital input signal 600), respectively.

A D/A converter, according to a fifth aspect of the present invention, is featured by that in the D/A converter, the switch circuit includes: a Pch transistor (Pch transistors 73, 74, 77) for constituting each of the switching elements; and a switch (SW1, SW2, SW3) for selecting a constant voltage (bias voltage 77, 80) by which the Pch transistor is operated in a saturation region and for applying the selected constant voltage to a gate of the Pch transistor when the switching element is selectively turned ON in response to the control signal.

A D/A converter, according to a sixth aspect of the present invention, is featured by that in the D/A converter, the current-to-voltage converting means (current/voltage converting circuit 507, 508) maintains a potential at the output terminal of the switch circuit at a constant value by keeping a potential at the input terminal (current input terminal 90) of the current-to-voltage converting means constant (reference voltage VREF).

A D/A converter, according to a seventh aspect of the present invention, is featured by that in the D/A converter, the decode means selects the switch circuit in response to the digital input signal, and also outputs such a control signal used to supply a unit current to the switch circuit, the unit current being produced by shunting the constant current in correspondence with a total number of the selected switch circuits.

In this invention, the constant current is supplied to the switch circuits, and the constant current is equally distributed to a plurality of current paths of the switch circuits in response to the digital input signal, so that the output current value can be varied. As a result, in the prior art, the current value is increased/decreased in the unit of the constant current, whereas the current value can be increased/decreased based upon such a unit current produced by equally dividing the constant current, and also the resolution can be improved without increasing a total number of the constant current sources. While the resolution may be determined based upon a total number of these current paths, in the case that the constant current is divided into two current paths, the resulting resolution can be increased by 1 bit (namely, two times). Accordingly, when the same resolution as that of the conventional D/A converter is obtained, the necessary occupied area of the D/A converter according to the present invention may be reduced by ½, or less. In other words, when the same occupied area is used, the resultant resolution may be increased more than two times higher than that of the prior art.

In this invention, the constant current of a single constant current source is shunted in correspondence with a total number of the switch circuits which are selected by operating the upper-stage switching elements. Furthermore, the shunted current is subdivided based upon a total number of such current paths which are formed by operating the lower-stage switching elements so as to obtain the unit current. As a consequence, the resolution can be improved without increasing a total number of these constant current sources. In addition, while a total number of the selected switch circuits is changed in response to the digital input signal, the current is variable in response to the quantity of these switch circuits, which is supplied to the current paths which form the unit current. As a result, the resolution in the vicinity of the center can be increased, as compared with that of the conventional structure. Also, since the unit current can be varied, the resolution can be readily changed, whereas the resolution of the conventional D/A converter is changed by controlling the capacity of the constant current source.

In this invention, the current can be equally divided into the respective current paths irrespective of the characteristics of the respective switching elements (transistors).

In this invention, since the potential at the input terminal of the current-to-voltage converting means is kept constant, the potential at the output terminal of the switch circuit can also be kept constant, which is connected to the input terminal. As a consequence, the current which flows through the current paths of the switch circuits can be equally divided in high precision.

In this invention, in particular, such a decode means can be obtained which may allocate the digital input signal to the analog output in such a manner that the quantizing noise in the vicinity of the center can become minimum in response to such an output signal as a sine wave having a large changing ratio in the vicinity of a center of this sine wave.

BRIEF DESCRIPTION OF THE DRAWINGS

FIG. 11 is a structural diagram for showing the current cell circuit employed in the conventional D/A converter.

FIG. 12 is an explanatory diagram for explaining operations of the current cell circuit employed in the conventional D/A converter.

FIG. 13 is a structural diagram for indicating the current-to-voltage converting circuit employed in the conventional D/A converter.

DESCRIPTION OF THE PREFERRED EMBODIMENTS

Referring now to drawings, various embodiment modes of the present invention will be described.

(Embodiment Mode 1)

Figure 1:
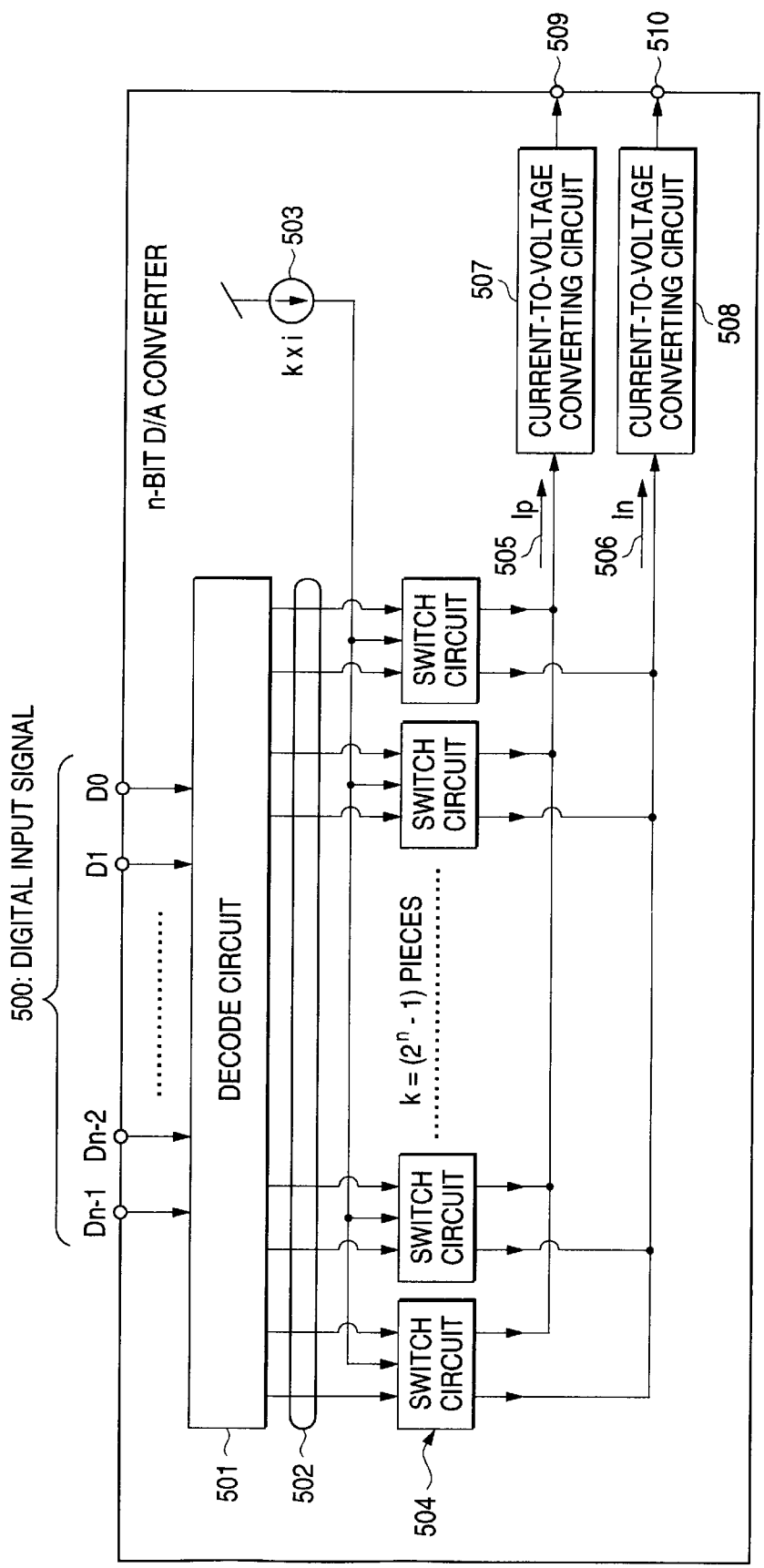
FIG. 1 is a structural diagram as to a D/A converter according to a first embodiment mode of the present invention.

FIG. 1 is a structural diagram of an n-bit D/A converter according to a first embodiment mode of the present invention. In this drawing, reference numeral 500 shows an n-bit digital input signal, reference numeral 501 represents a decode circuit for outputting "2×k" pieces of control signals which are used to control a total number of current paths in response to the digital input signal 500 (symbol "k" is equal to "$2^n-1$"), and reference numeral 502 represents "k" pieces of current path selection signals outputted from the decode circuit 501. Also, reference numeral 503 indicates a constant current source for supplying (k×i) currents, and reference numeral 504 shows "k" pieces of switch circuits which are selected by the current path selection signal 502. Further, reference numeral 505 is an output current produced by adding output currents derived from one current path within the two current paths in all of the current switch circuits 504, and reference numeral 506 represents an output current produced by adding all of output currents derived from such current paths located opposite to the side of the output current 505 within the two current paths in all of the switch circuits 504. Also, reference numeral 507 shows a current-to-voltage converting circuit for converting the output current 505 into a voltage corresponding thereto, reference numeral 508 denotes a current-to-voltage converting circuit for converting the output current 506 into a voltage corresponding thereto, reference numeral 509 represents an analog output terminal from which the voltage converted by the current-to-voltage converting circuit 507 is outputted, and reference numeral 510 shows an analog output terminal from which the voltage converted by the current-to-voltage converting circuit 508 is outputted.

Figures 2, 3:
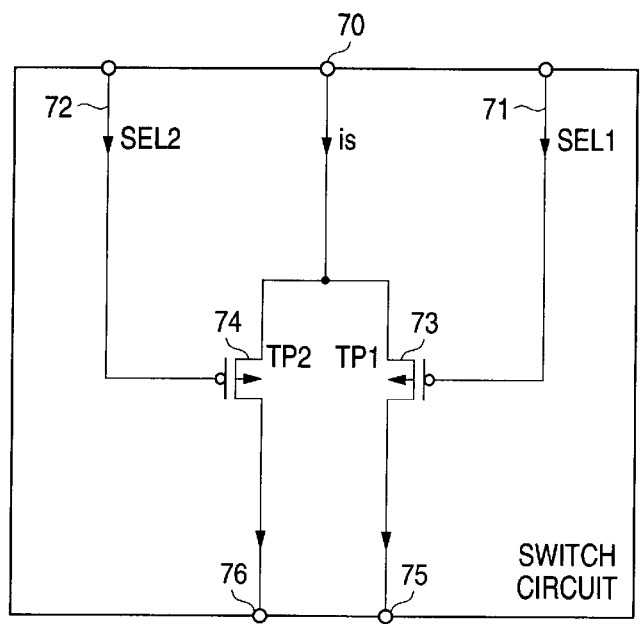
FIG. 2 is a structural diagram as to a switch circuit of the D/A converter according to the first embodiment mode of the present invention.
FIG. 3 is an explanatory diagram for explaining operations of the switch circuit of the D/A converter according to the first embodiment mode of the present invention.

FIG. 2 is a structural diagram of the switch circuit 504. In this drawing, reference numeral 70 shows a current input terminal, reference numerals 71 and 72 indicate current path selection signals, and reference numeral 73 represents a Pch transistor having a switch function, which is connected to the side of the current path selection signal 71. Also, reference numeral 74 denotes a Pch transistor having the same characteristic as that of the Pch transistor 73 having the switch function, which is connected to the side of the current path selection signal 72, reference numeral 75 represents a current output terminal to which a current is supplied when this current output terminal is selected by the current path selection signal 71, and also reference numeral 76 indicates a current output terminal to which a current is supplied when this current output terminal is selected by the current path selection signal 72. Next, a description will now be made of operations of the switch circuits shown in FIG. 2. As indicated in FIG. 2, while the current path selection signal 71 is connected to the gate of the Pch transistor 73, and the current path selection signal 72 is connected to the gate of the Pch transistor 74, these transistors 73 and 74 are independently controlled, so that a total number of the output current paths of the switch circuits may be controlled.

FIG. 3 represents a relationship diagram for explaining a relationship among the current path selection signal 71 (SEL1), the current path selection signal 72 (SEL2), a value of a current flowing through the current input terminal 70, a value of a current outputted to the current output terminal 75, and a value of a current outputted to the current output terminal 76.

First, in the case of the current path selection signals (SEL1, SEL2)=(1, 1), since both the Pch transistor 73 (TP1) and the Pch transistor 74 (TP2) are turned OFF, a total number of the current paths becomes zero, so that all of the current value flowing through the current input terminal 70, the current value outputted to the current output terminal 75, and the current value outputted to the current output terminal 76 become zero.

Next, when the current path selection signals (SEL1, SEL2)=(1, 0), the Pch transistor 73 (TP1) is turned OFF and the Pch transistor 74 (TP2) is turned ON, so that a total number of the current paths becomes 1. Assuming now that the current value supplied to the current input terminal 70 is "is", the current value supplied to the current output terminal 76 becomes "is", and also the current value supplied to the current output terminal 75 becomes zero.

Next, when the current path selection signals (SEL1, SEL2)=(0, 1), the Pch transistor 73 (TP1) is turned ON and the Pch transistor 74 (TP2) is turned OFF, so that a total number of the current paths becomes 1. Assuming now that the current value supplied to the current input terminal 70 is "is", the current value supplied to the current output terminal 76 becomes "0", and also the current value supplied to the current output terminal 75 becomes "is."

Next, when the current path selection signals (SEL1, SEL2)=(0, 0), the Pch transistor 73 (TP1) is turned ON and the Pch transistor 74 (TP2) is turned ON, so that a total number of the current paths becomes 2. Since the Pch transistor 73 (TP1) and the Pch transistor 74 (TP2) own the same characteristics, the impedances thereof, as viewed from the current input terminal 70, are made identical to each other. Assuming now that the current value supplied to the current input terminal 70 is "is", a current value "is/2" which is obtained by equally dividing this current value "is" is supplied to both the current output terminal 75 and the current output terminal 76.

A description will now be made of operations of the n-bit D/A converter with employment of the above-described structure shown in FIG. 1. It should be noted that although there are plural combinations of the current path control signals capable of realizing "n-bit" resolution, one example of these signal combinations is indicated below. In the case that the current path is selected in such a manner that all of "k" pieces of these swich circuits 504 may cause the currents to flow only through the side of the output current 506, the current (k×i) supplied from the constant current source 503 is equally distributed to "k" pieces of the current paths. As a consequence, the current flowing through each of these current paths becomes "i", and all of these currents "i" are added to each other on the side of the output current 506, so that the output current 505 becomes zero and the output current 506 becomes (k×i).

Since a total number of the entire current paths is not changed by switching the switch circuit in response to a change in the digital input signal in such a manner that the current cell selection signals may flow through the current paths on the side of the output current 505, the currents may be added to the output current 505 in the unit of the current "i" which passed through each of the current paths. Since a total number of the switch circuits 504 is equal to "k" pieces, the gradation of the output currents from the switch circuits 504 becomes "$2_n$", namely such a D/A converter having n-bit resolution can be realized.

In such a case that both the current paths are not selected with respect to "g" pieces of switch circuits, currents which flow through (k−g) pieces of the remaining switch circuits become (k/(k−g))×i, so that the unit current can be changed. Since either the current path provided on the side of the output current 505 or the current path provided on the side of the output current 506 is selected, this current may be increased/decreased in the unit of (k/(k−g))×i. Also, since the available values of the output current in the vicinity of the center are furthermore increased by changing "g", the resulting resolution may be increased.

Since the resolution in the vicinity of the center is increased, there particularly is a merit when outputting a signal like sine wave or such having a large changing ratio near a center. In such a case, a decode circuit for allocating a digital input signal to an analog output is employed in order that quantizing errors may be minimized in the D/A converter, it is possible to produce a signal having high precision. As a result, the resolution of the D/A converter can be readily improved without increasing the circuit scale.

With employment of the above-explained structure, in the case that a total number of these switch circuits is made equal to that of the conventional converter structure, a total quantity of the constant current sources may become $1/(2^n-1)$, so that the element numbers can be largely reduced as well as the resolution of this D/A converter can be further increased, as compared with those of the conventional converter structure.

(Embodiment Mode 2)

Figure 4:
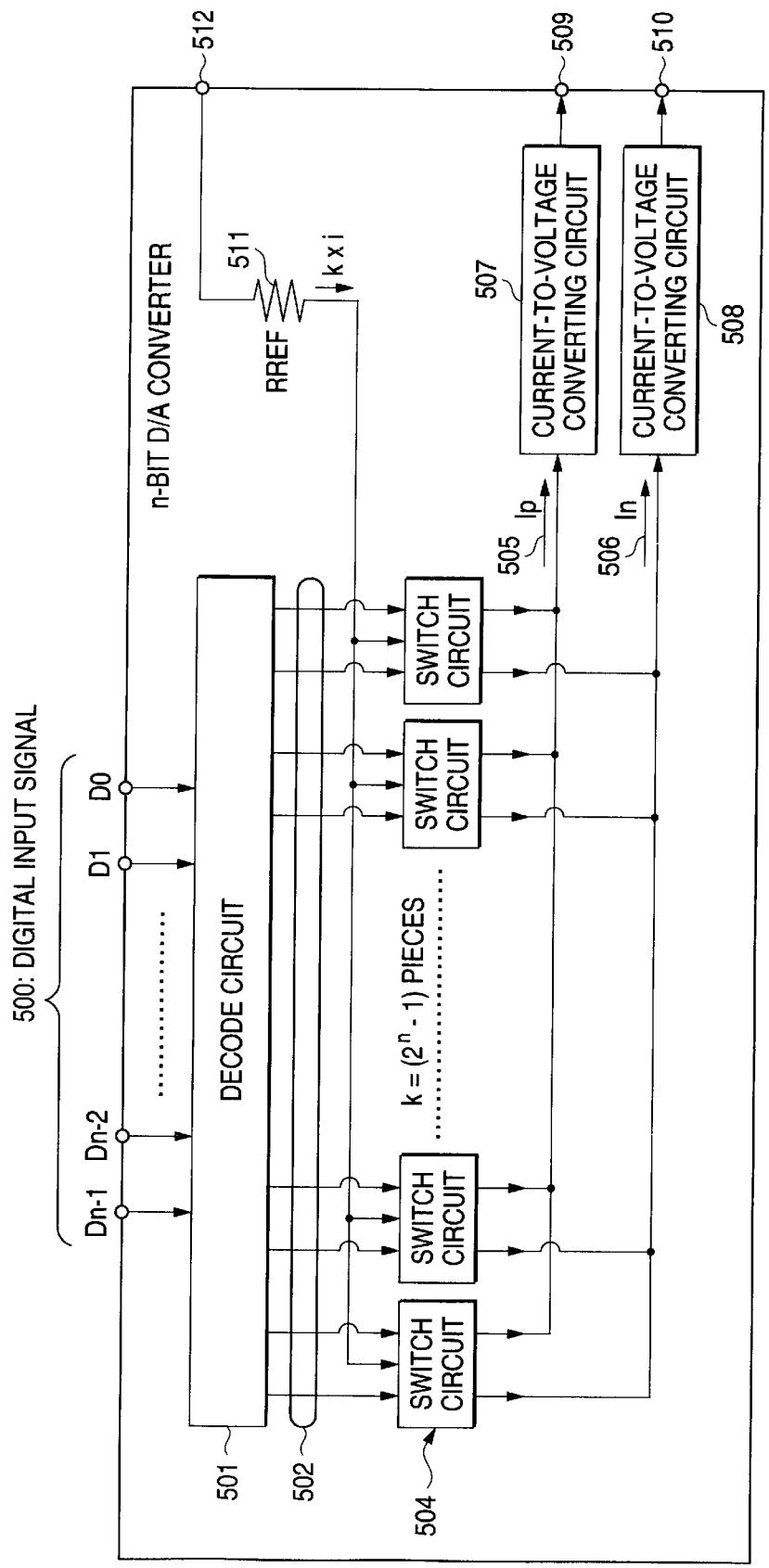
FIG. 4 is a structural diagram as to a D/A converter according to a second embodiment mode of the present invention.

FIG. 4 is a structural diagram of an n-bit D/A converter according to a second embodiment mode of the present invention. That is, in the D/A converter of the first embodiment mode, a resistive element 511 is newly provided instead of the constant current source, and a constant voltage is applied to a constant voltage input terminal 512 which constitutes one end of this resistive element 511, so that the n-bit D/A converter of the second embodiment mode operable in a similar manner to that of the first embodiment mode may be realized. Since the D/A converter no longer requires the constant current source by employing this circuit arrangement, the circuit area thereof can be further reduced.

(Embodiment Mode 3)

Figure 5:
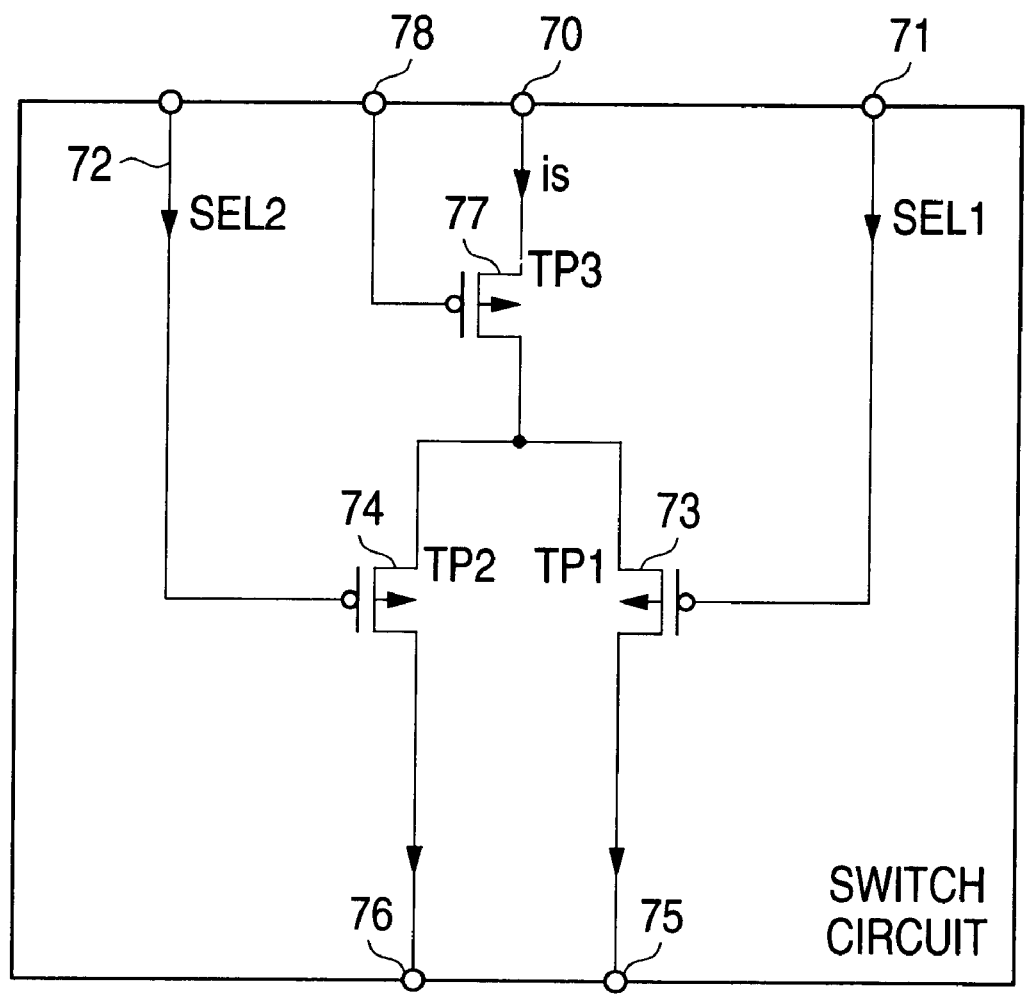
FIG. 5 is a structural diagram as to a switch circuit of the D/A converter according to a third embodiment mode of the present invention.

FIG. 5 indicates a D/A converter according to a third embodiment mode of the present invention. This D/A converter of the third embodiment mode is arranged by that a Pch transistor 77 is series-connected to the switch circuit 504 of the D/A converter according to the first embodiment mode, and an upper-stage current path selection signal 78 is inputted to the gate of the Pch transistor 77. The D/A converter having this switch circuit is equivalent to the D/A converter in FIG. 1 whose decode circuit is replaced by such a decode circuit for outputting the upper-stage current path selection signal to the respective switch circuits. The operation of the D/A converter with employment of this arrangement is featured by that resolution in the vicinity of the center can be further improved, as compared with that of the D/A converter of the first embodiment mode because of the following reason. That is, such a current which is equally divided by the number equal to a total number of such current paths which are turned ON by receiving the upper-stage current path selection signal may be furthermore and equally subdivided by a lower-stage switch. Other operations of this D/A converter are identical to those of the first embodiment mode.

(Embodiment Mode 4)

Figure 6:
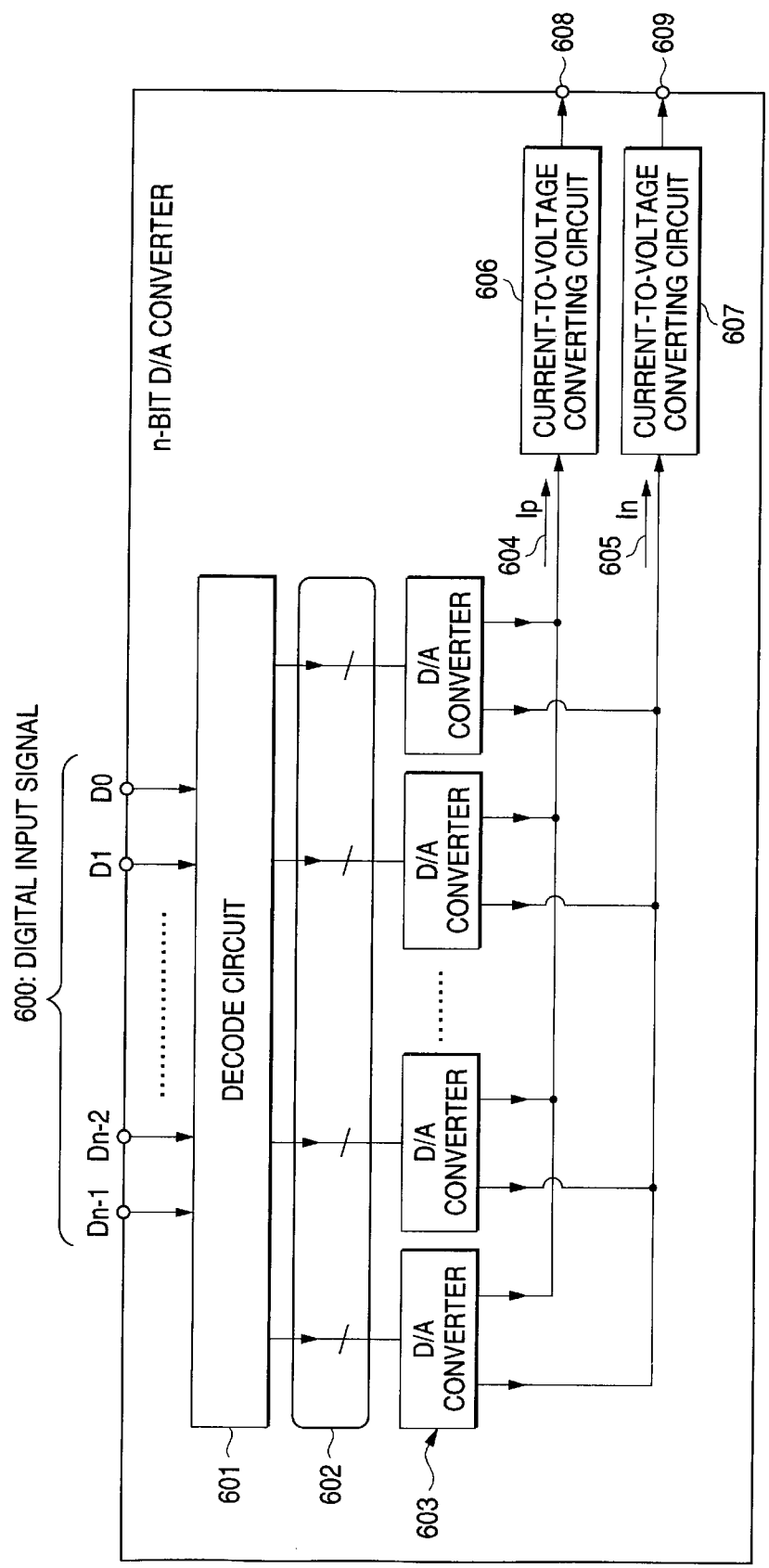
FIG. 6 is a structural diagram as to a D/A converter according to a fourth embodiment mode of the present invention.

FIG. 6 is a structural diagram of an n-bit D/A converter according to a fourth embodiment mode of the present invention. This D/A converter of the fourth embodiment mode is featured by such a D/A converter constituted by employing a plurality of the above-explained D/A converters as recited in the embodiment modes 1, 2, 3 of the present invention. In FIG. 6, reference numeral 600 shows an n-bit digital input signal, and reference numeral 601 indicates a decode circuit for outputting a signal used to control a plurality of D/A converters 603 of the present invention in response to the digital input signal 600. Also, reference numeral 602 represents a D/A converter control signal outputted from the decode circuit 601, reference numeral 604 shows one output current summation calculated in all of the D/A converters 603, and reference numeral 605 indicates the other output current summation calculated in all of the D/A converters. Also, reference numeral 606 shows a current-to-voltage converting circuit for converting the output current 604 into a voltage corresponding thereto, reference numeral 607 denotes a current-to-voltage converting circuit for converting the output current 605 into a voltage corresponding thereto, reference numeral 608 represents an analog output terminal from which the voltage converted by the current-to-voltage converting circuit 606 is outputted, and reference numeral 609 shows an analog output terminal from which the voltage converted by the current-to-voltage converting circuit 607 is outputted. With employment of this arrangement, since the output current values of the respective D/A converters may be changed into various current values, the resolution of the D/A converter can be improved.

(Embodiment Mode 5)

Figure 7:
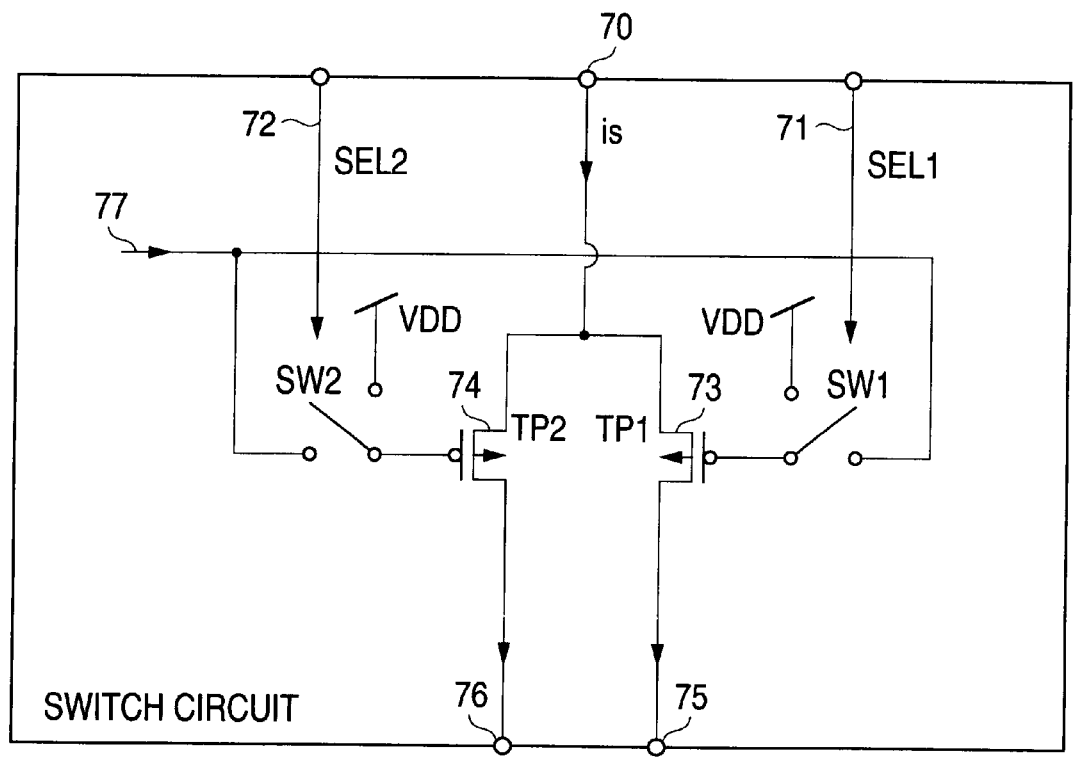
FIG. 7 is a structural diagram as to a switch circuit of a D/A converter according to a fifth embodiment mode of the present invention.

FIG. 7 is a structural diagram of a switch circuit according to claim 5 of the present invention. It should be understood that since descriptions of reference numerals shown in FIG. 7 are the same as those of FIG. 2, these explanations are omitted. This switch circuit is controlled in the following manner. That is, when the switches SW1 and SW2 are turned ON in response to the current path selection signals 71 and 72, such a bias voltage 77 is applied to gates of respective Pch transistors 73 and 74 by which these Pch transistors 73 and 74 are operable in a saturation region, whereas when the switches SW1 and SW2 are turned OFF, this bias voltage 77 is fixed to a power supply voltage VDD. Since such a circuit arrangement is employed, currents which flow through the respective current paths may be determined based upon a potential difference between the current input terminal 70 and the bias voltage 77 irrespective of such a fact that the potential at the current output terminal 75 is not made coincident with the potential at the current output terminal 76.

Figure 8:
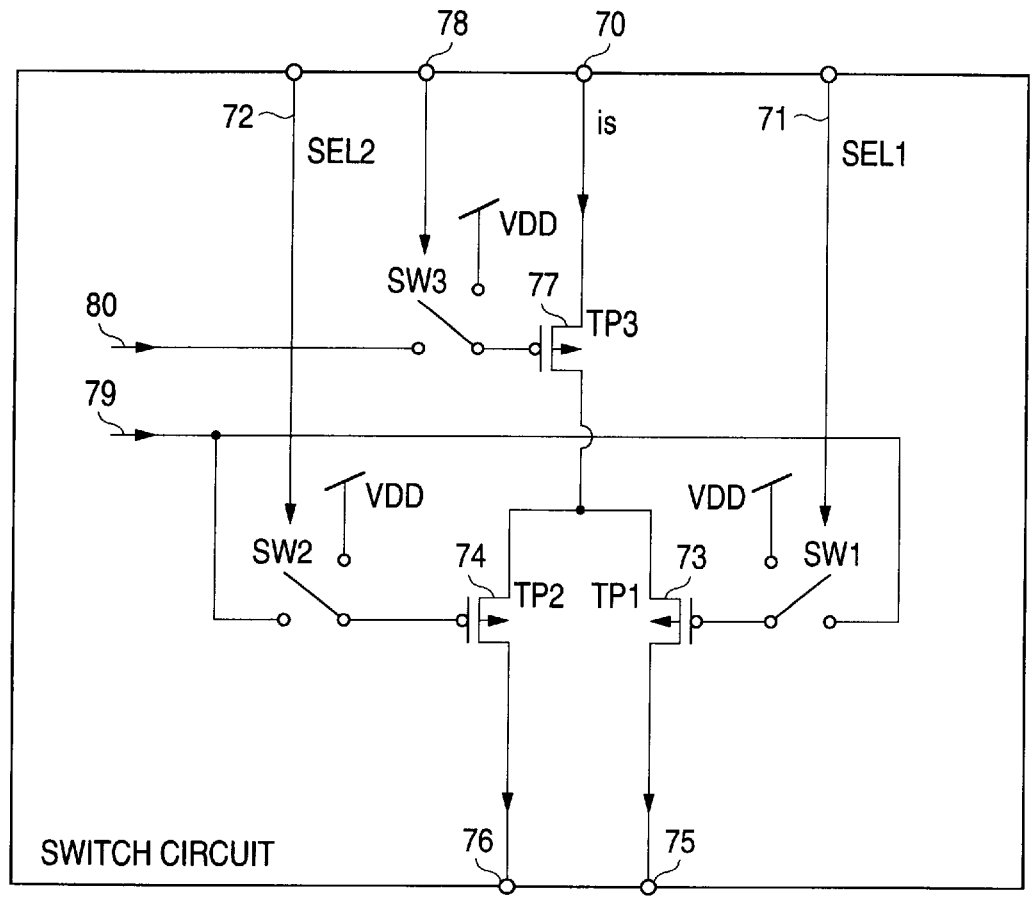
FIG. 8 is a structural diagram as to a switch circuit of the D/A converter according to the fifth embodiment mode of the present invention.

FIG. 8 is a structural diagram of a switch circuit arranged by employing the switch circuit shown in FIG. 5. It should be noted that in FIG. 8, explanations of reference numerals applied to the same components of FIG. 5 are omitted. In FIG. 8, reference numeral 79 indicates a bias voltage 1. This bias voltage 1 is applied to the gates of the Pch transistors 73 and 74 which constitute a lower-stage switch circuit when switches SW1 and SW2 are turned ON. Also, reference numeral 80 represents another bias voltage 2. This bias voltage 2 is applied to a gate of a Pch transistor 77 which constitutes an upper-stage switch circuit when a switch SW3 is turned ON. The respective bias voltages are such voltages which are adjusted in such a manner that the Pch transistors are operable in the saturation region. With employment of this circuit arrangement, the current may be equally subdivided to the respective current paths irrespective of the states of the respective switch circuits.

(Embodiment Mode 6)

Figure 9:
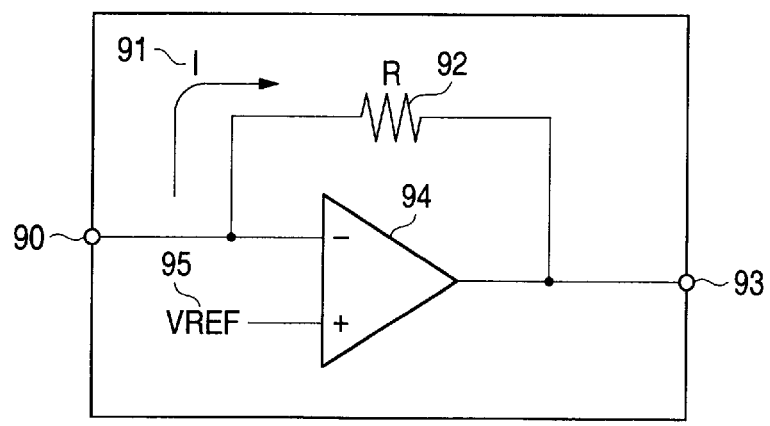
FIG. 9 is a structural diagram for showing a current-to-voltage converting circuit of a D/A converter according to a sixth embodiment mode of the present invention.
Figure 10:
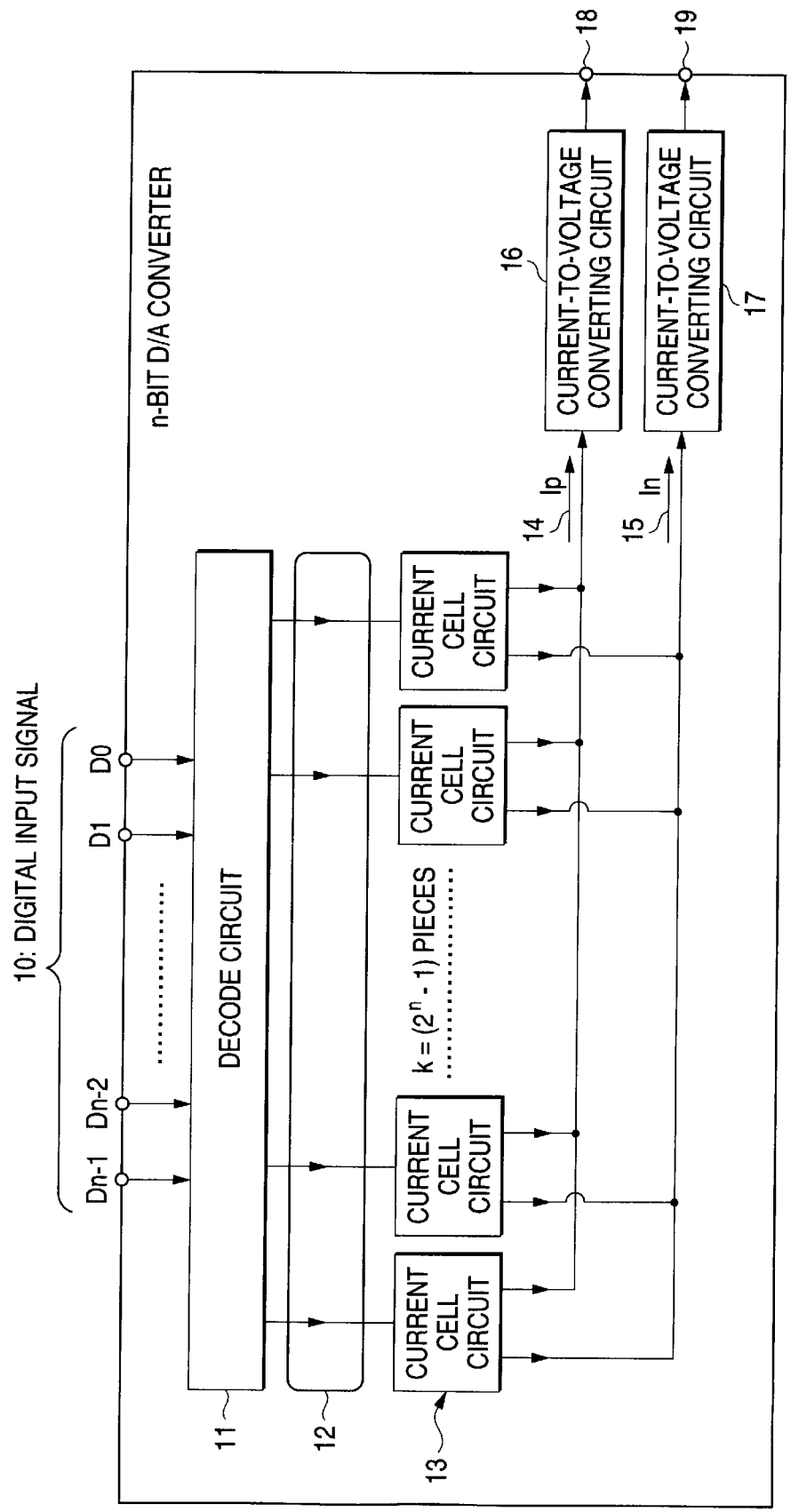
FIG. 10 is a structural diagram for representing the conventional D/A converter.

FIG. 9 is a structural diagram for showing a current-to-voltage converting circuit according to claim 6 of the present invention. In FIG. 9, reference numeral 90 indicates a current input terminal, reference numeral 91 shows an input current which is entered from the current input terminal 90, reference numeral 92 indicates a resistive element having a resistance value R, and reference numeral 93 represents a voltage output terminal from which a voltage corresponding to the input current 91 is outputted. Also, reference numeral 94 is an operational amplifying circuit, and reference numeral 95 represents a reference voltage (VREF) which is inputted to a non-inverting terminal (+) of the operational amplifier. The current-to-voltage converting operation of this current-to-voltage converting circuit is performed as follows: That is, since a potential at the current input terminal 90 is maintained at the reference voltage VREF by the operational amplifying circuit 94, such a differential voltage defined by "VREF-R×i" is outputted from the voltage output terminal 93, so that an input current "i" is converted into such an output voltage corresponding to this current "i." Since this current-voltage converting circuit is employed, the potential at the current input terminal 90 is kept at a constant potential. As a consequence, the potential differences at the upper ends of the switch circuits which are connected to the respective current paths are identical to each other, the currents may be equally divided into the respective current paths.

As previously explained in detail, in accordance with the present invention, since the current supplied from the constant current source is equally divided into a plurality of current paths so as to produce the unit current, and also the switches series-connected to the respective current paths are controlled in response to the digital input signal in order to change the output current value, the occupied area of the D/A converter can be made smaller than that of the conventional D/A converter. This will make it possible, in such a technical field of digital mobile communication terminal apparatuses which are known as digital processing systems, to make the terminal apparatuses more compact and lighter. At the same time, since the unit current is variable in response to the digital input signal, the resolution in the vicinity of the center can be largely improved, as compared with that of the conventional D/A converter.

What is claimed is:

1. A D/A converter comprising:
   a constant current source;
   a switch group constituted by switch circuits, which is series-connected to said constant current source, and is operated in response to a control signal to form a plurality of current paths for equally dividing a constant current of said constant current source;
   decode means for outputting said control signal used to control operations of said switch circuits in response to a digital input signal; and
   current-to-voltage converting means for adding currents to each other which are outputted via said current paths of said switch circuits so as to convert the added currents into a voltage.

2. A D/A converter as claimed in claim 1 wherein:
   said constant current is obtained by employing a resistive element having one end to which a constant voltage is added instead of said constant current source.

3. A D/A converter as claimed in claim 1, wherein:
   said constant current source is a single constant current source;
   said switch circuit includes: a plurality of lower-stage switching elements for forming said plurality of current paths; and an upper-stage switching element which is series-connected to an upper stage of each of said lower-stage switching elements, and forms a current path for determining a shunt value of said constant currents supplied to said plurality of current paths; and said decode means outputs such a control signal capable of independently controlling the respective switching elements.

4. A D/A converter wherein:

a plurality of D/A converters recited in claim 1 are connected in parallel to each other; and said D/A converter is comprised of decode means for outputting such a signal used to control the respective decode means which constitute said D/A converters in response to a digital input signal, respectively.

5. A D/A converter as claimed in claim 4 wherein:

said switch circuit includes:
- a Pch transistor for constituting each of the switching elements; and
- a switch for selecting a constant voltage by which said Pch transistor is operated in a saturation region and for applying the selected constant voltage to a gate of said Pch transistor when said switching element is selectively turned ON in response to said control signal.

6. A D/A converter as claimed in any one of claims 1, 2, 4 and 5 wherein:

said current-to-voltage converting means maintains a potential at the output terminal of said switch circuit at a constant value by keeping a potential at the input terminal of said current-to-voltage converting means constant.

7. A D/A converter as claimed in any one of claims 1, 2, 4 and 5 wherein:

said decode means selects said switch circuit in response to said digital input signal, and also outputs such a control signal used to supply a unit current to said switch circuit, said unit current being produced by shunting said constant current in correspondence with a total number of the selected switch circuits.

8. A digital communication terminal apparatus wherein:

the D/A converter recited in any one of claims 1 to 5 is mounted; and said digital input signal is transferred via a digital signal processing circuit.

* * * * *